US012777751B2

(12) United States Patent
Chen et al.

(10) Patent No.: US 12,777,751 B2
(45) Date of Patent: Oct. 27, 2026

(54) MICRO LIGHT-EMITTING CHIP STRUCTURE AND MICRO DISPLAY STRUCTURE

(71) Applicant: PlayNitride Display Co., Ltd., Zhunan Township, Miaoli County (TW)

(72) Inventors: Yen-Yeh Chen, Zhunan Township (TW); Bo-Wei Wu, Zhunan Township (TW)

(73) Assignee: PLAYNITRIDE DISPLAY CO., LTD., Zhunan Township (TW)

( * ) Notice: Subject to any disclaimer, the term of this patent is extended or adjusted under 35 U.S.C. 154(b) by 580 days.

(21) Appl. No.: 18/328,190

(22) Filed: Jun. 2, 2023

(65) Prior Publication Data

US 2024/0222560 A1 Jul. 4, 2024

Related U.S. Application Data

(63) Continuation-in-part of application No. 18/147,474, filed on Dec. 28, 2022, now Pat. No. 12,652,891.

(51) Int. Cl.
*H01L 33/38* (2010.01)
*H01L 33/62* (2010.01)
(Continued)

(52) U.S. Cl.
CPC ...... *H10H 20/8312* (2025.01); *H10H 20/841* (2025.01); *H10H 20/857* (2025.01); *H10W 90/00* (2026.01)

(58) Field of Classification Search
CPC ... H10H 20/857; H10H 20/835; H01L 25/167
See application file for complete search history.

(56) References Cited

U.S. PATENT DOCUMENTS

2016/0148973 A1* 5/2016 Saito .................... H10H 20/811 257/90
2018/0130924 A1* 5/2018 Ko ....................... H10H 20/857
(Continued)

FOREIGN PATENT DOCUMENTS

CN 112259658 A 1/2021
KR 10-2008-0002161 A 1/2008
(Continued)

OTHER PUBLICATIONS

Chinese Office Action and Search Report for Chinese Application No. 202211693360.5, dated Jun. 18, 2025.
(Continued)

*Primary Examiner* — Kretelia Graham
*Assistant Examiner* — David J Goodwin
(74) *Attorney, Agent, or Firm* — Birch, Stewart, Kolasch & Birch, LLP

(57) ABSTRACT

The micro light-emitting chip structure includes a first-type semiconductor layer, a light-emitting layer, and a second-type semiconductor layer that has an end surface. The micro light-emitting chip structure also includes a first insulating layer, a reflective layer, and a second insulating layer disposed on the second-type semiconductor layer. The micro light-emitting chip structure further includes an electrode and a dielectric structure. The electrode is disposed on the end surface and penetrates the second insulating layer, the reflective layer, and the first insulating layer. The dielectric structure is between the electrode and the reflective layer and surrounds the electrode. The annular sidewall of the dielectric structure has a first end away from the second-type semiconductor layer and a second end close to the second-type semiconductor layer. The inner diameter of the first end is greater than or equal to the inner diameter of the second end.

11 Claims, 9 Drawing Sheets

(51) Int. Cl.

| | |
|---|---|
| ***H10H 20/831*** | (2025.01) |
| ***H10H 20/841*** | (2025.01) |
| ***H10H 20/857*** | (2025.01) |
| ***H10W 90/00*** | (2026.01) |

(56) References Cited

U.S. PATENT DOCUMENTS

2019/0115333 A1* 4/2019 Wu ........................ H10W 90/00
2020/0357955 A1* 11/2020 Chuang .............. H10H 20/8314

FOREIGN PATENT DOCUMENTS

| | | | |
|---|---|---|---|
| KR | 10-2019-0140435 | A | 12/2019 |
| KR | 10-2021-0070926 | A | 6/2021 |
| KR | 10-2021-0144983 | A | 12/2021 |
| TW | 202036933 | A | 10/2020 |
| TW | 202234721 | A | 9/2022 |

OTHER PUBLICATIONS

Korean Office Action for Korean Application No. 10-2023-0190153, dated Aug. 18, 2025, with English translation.

* cited by examiner

MICRO LIGHT-EMITTING CHIP STRUCTURE AND MICRO DISPLAY STRUCTURE

CROSS REFERENCE TO RELATED APPLICATIONS

This application is a Continuation-In-Part of pending U.S. patent application Ser. No. 18/147,474, filed Dec. 28, 2022 and entitled "MICRO LIGHT-EMITTING CHIP STRUCTURE AND MICRO DISPLAY STRUCTURE", the entirety of which is incorporated by reference herein.

BACKGROUND OF THE INVENTION

Field of the Invention

The present invention relates to a micro light-emitting chip structure, and in particular, to a micro light-emitting chip structure that includes a dielectric structure having an annular sidewall with a variable inner diameter.

Description of the Related Art

The volume of many optoelectronic components has gradually been miniaturized thanks to the advancements being made in the field of optoelectronic technology. Compared with organic light-emitting diode (OLED) technology, micro light-emitting diodes (mLEDs/uLEDs) have the advantages of high efficiency, longer lifetime, and relatively stable materials that are not affected by the environment. Therefore, displays that employ arrays of micro light-emitting diodes are gaining increased attention on the consumer and professional market.

Recently, the technical trend in micro light-emitting diodes has been toward increasing the number of pixels per inch (PPI) in order to further improve the image resolution of the display. To achieve this objective, manufacturers have used a number of methods to reduce the pixel size of the micro light-emitting chip structure, one of which has been narrowing the process line width and adopting an array structure for a common electrode. However, while the pixel sizes are decreased, as time goes by, the design and fabrication of micro light-emitting chip structures continue to pose various challenges.

For example, in the multi-layer structure of the micro light-emitting chip, if the materials of each layer are different, when the subsequent process includes dry etching and wet etching, the etch selectivity of these materials may lead to a hollow structure. The hollow structure is likely to cause abnormalities in the subsequent processing, resulting in a decrease in the overall yield of micro light-emitting chip structures.

BRIEF SUMMARY OF THE INVENTION

According to some embodiments of the present disclosure, a micro light-emitting chip structure and a micro display structure using the same are provided. The micro light-emitting chip structure includes a dielectric structure having an annular sidewall, which may effectively reduce the chance of producing hollow structures.

An embodiment of the present disclosure provides a micro light-emitting chip structure. The micro light-emitting chip structure includes a first-type semiconductor layer, a light-emitting layer disposed on the first-type semiconductor layer, and a second-type semiconductor layer disposed on the light-emitting layer. The second-type semiconductor layer has a peripheral surface and an end surface that is connected to the peripheral surface. The micro light-emitting chip structure also includes a first insulating layer disposed on the second-type semiconductor layer, a reflective layer disposed on the first insulating layer and covering the end surface, and a second insulating layer disposed on the reflective layer. The micro light-emitting chip structure further includes an electrode and a dielectric structure. The electrode is disposed on the end surface and connected to the second-type semiconductor layer. The electrode penetrates the second insulating layer, the reflective layer, and the first insulating layer. The dielectric structure is between the electrode and the reflective layer and surrounding the electrode. The dielectric structure has a first annular sidewall facing the electrode. The first annular sidewall has a first end away from the second-type semiconductor layer and a second end close to the second-type semiconductor layer. The inner diameter of the first end is greater than or equal to the inner diameter of the second end.

An embodiment of the present disclosure provides a micro display structure. The micro display structure includes a display substrate and micro light-emitting chip structures arranged on the display substrate. Each micro light-emitting chip structure includes a first-type semiconductor layer, a light-emitting layer disposed on the first-type semiconductor layer, and a second-type semiconductor layer disposed on the light-emitting layer. The second-type semiconductor layer has a peripheral surface and an end surface that is connected to the peripheral surface. Each micro light-emitting chip structure also includes a first insulating layer disposed on the second-type semiconductor layer, a reflective layer disposed on the first insulating layer and covering the end surface, and a second insulating layer disposed on the reflective layer. Each micro light-emitting chip structure further includes an electrode and a dielectric structure. The electrode is disposed on the end surface and connected to the second-type semiconductor layer. The electrode penetrates the second insulating layer, the reflective layer, and the first insulating layer. The dielectric structure is between the electrode and the reflective layer and surrounding the electrode. The dielectric structure has a first annular sidewall facing the electrode. The first annular sidewall has a first end away from the second-type semiconductor layer and a second end close to the second-type semiconductor layer. The inner diameter of the first end is greater than or equal to the inner diameter of the second end.

BRIEF DESCRIPTION OF THE DRAWINGS

The disclosure can be more fully understood from the following detailed description when read with the accompanying figures. It is worth noting that, in accordance with standard practice in the industry, various features are not drawn to scale. In fact, the dimensions of the various features may be arbitrarily increased or reduced for clarity of discussion.

DETAILED DESCRIPTION OF THE INVENTION

Figure 1:
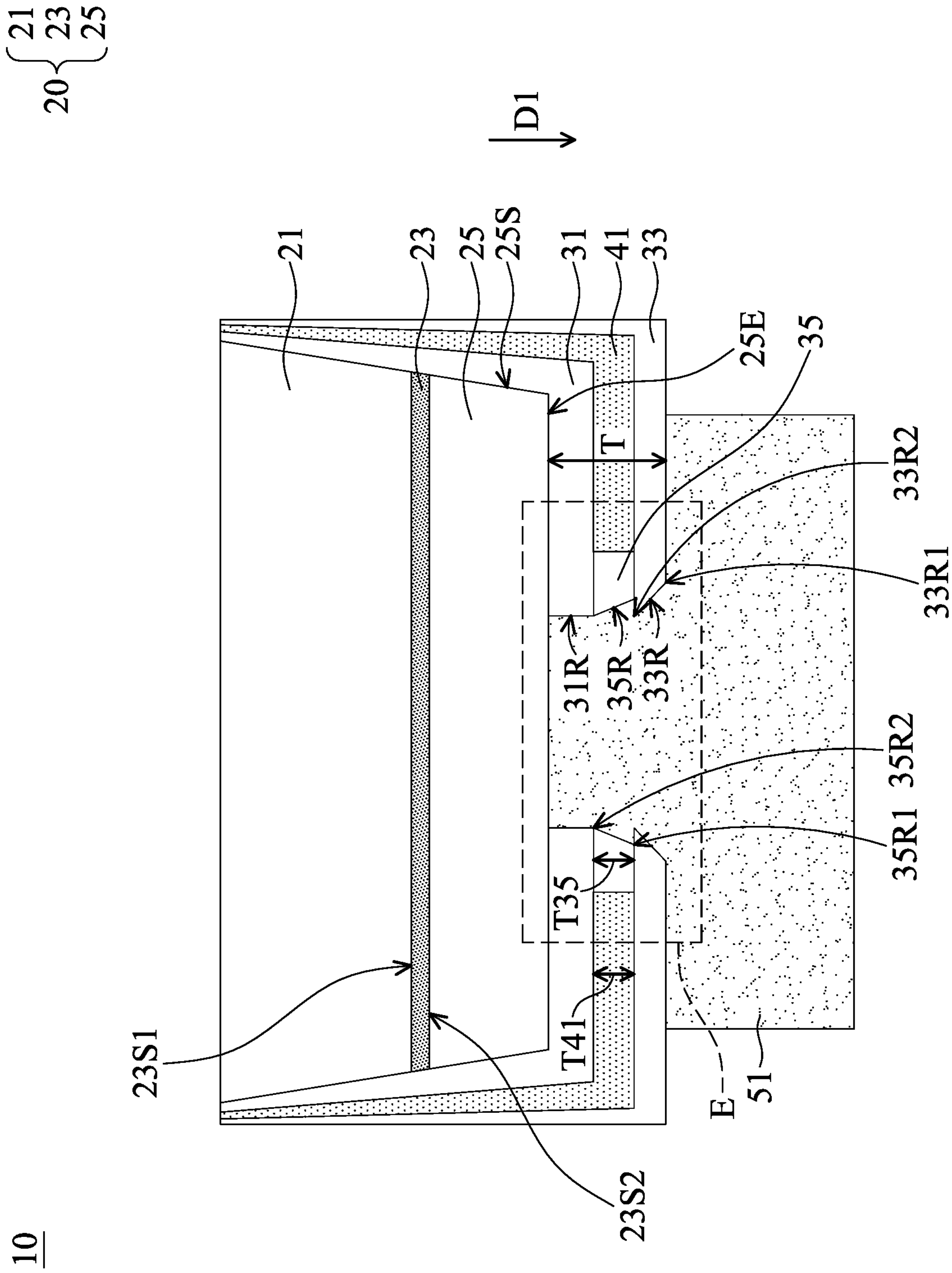
FIG. 1 is a cross-sectional view illustrating a portion of the micro light-emitting chip structure according to some embodiments of the present disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, a first feature is formed on a second feature in the description that follows may include embodiments in which the first feature and second feature are formed in direct contact, and may also include embodiments in which additional features may be formed between the first feature and second feature, so that the first feature and second feature may not be in direct contact.

It should be understood that additional steps may be implemented before, during, or after the illustrated methods, and some steps might be replaced or omitted in other embodiments of the illustrated methods.

Furthermore, spatially relative terms, such as "beneath," "below," "lower," "on," "above," "upper" and the like, may be used herein for ease of description to describe one element or feature's relationship to other elements or features as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the present disclosure, the terms "about," "approximately" and "substantially" typically mean+/−20% of the stated value, more typically +/−10% of the stated value, more typically +/−5% of the stated value, more typically +/−3% of the stated value, more typically +/−2% of the stated value, more typically +/−1% of the stated value and even more typically +/−0.5% of the stated value. The stated value of the present disclosure is an approximate value. That is, when there is no specific description of the terms "about," "approximately" and "substantially", the stated value includes the meaning of "about," "approximately" or "substantially".

Unless otherwise defined, all terms (including technical and scientific terms) used herein have the same meaning as commonly understood by one of ordinary skill in the art to which this disclosure belongs. It should be understood that terms such as those defined in commonly used dictionaries should be interpreted as having a meaning that is consistent with their meaning in the context of the relevant art and will not be interpreted in an idealized or overly formal sense unless expressly so defined in the embodiments of the present disclosure.

The present disclosure may repeat reference numerals and/or letters in following embodiments. This repetition is for the purpose of simplicity and clarity and does not in itself dictate a relationship between the various embodiments and/or configurations discussed.

FIG. 1 is a cross-sectional view illustrating a portion of the micro light-emitting chip structure 10 according to some embodiments of the present disclosure. For example, the micro light-emitting chip structure 10 may be a micro light-emitting diode (micro LED). It should be noted that some components of the micro light-emitting chip structure 10 have been omitted in FIG. 1 for the sake of brevity.

Referring to FIG. 1, in some embodiments, the micro light-emitting chip structure 10 includes a first-type semiconductor layer 21, a light-emitting layer 23 disposed on the first-type semiconductor layer 21, and a second-type semiconductor layer 25 disposed on the light-emitting layer 23. As shown in FIG. 1, the second-type semiconductor layer 25 has a peripheral surface 25S and an end surface 25E that is connected to the peripheral surface 25S.

The first-type semiconductor layer 21 includes an N-type semiconductor material. For example, the first-type semiconductor layer 21 may include a group II-VI material (e.g., zinc selenide (ZnSe)) or a group III-V nitrogen compound material (e.g., gallium nitride (GaN), aluminum nitride (AlN), indium nitride (InN), indium gallium nitride (InGaN), aluminum gallium nitride (AlGaN) or aluminum indium gallium nitride (AlInGaN)), and the first-type semiconductor layer 21 may include dopants such as silicon (Si) or germanium (Ge), but the present disclosure is not limited thereto. Moreover, the first-type semiconductor layer 21 may be a single-layer or multi-layer structure.

The light-emitting layer 23 may include at least one undoped semiconductor layer or at least one low-doped semiconductor layer. For example, the light-emitting layer 23 may be a quantum well (QW) layer, which may include indium gallium nitride ($In_xGa_{1-x}N$) or gallium nitride (GaN), but the present disclosure is not limited thereto. Alternately, the light-emitting layer 23 may be a multiple quantum well (MQW) layer.

Lights emitted by the micro light-emitting chip structure 10 may be determined by the light-emitting layer 23. For example, the light-emitting layer 23 may emit red light, green light, or blue light, but the present disclosure is not limited thereto. The light-emitting layer 23 may also emit white light, cyan light, magenta light, yellow light, any other applicable color light, or a combination thereof.

As shown in FIG. 1, in some embodiments, the second-type semiconductor layer 25 is disposed on the side of the light-emitting layer 23 that is opposite the first-type semiconductor layer 21. For example, the first-type semiconductor layer 21 is disposed on the first side 23S1 of the light-emitting layer 23, and the second-type semiconductor layer 25 is disposed on the second side 23S2 of the light-emitting layer 23. The second-type semiconductor layer 25 includes a P-type semiconductor material. For example, the second-type semiconductor layer 25 may include a group II-VI material (e.g., zinc selenide (ZnSe)) or a group III-V nitrogen compound material (e.g., gallium nitride (GaN), aluminum nitride (AlN), indium nitride (InN), indium gallium nitride (InGaN), aluminum gallium nitride (AlGaN) or aluminum indium gallium nitride (AlInGaN)), and the second-type semiconductor layer 25 may include dopants such as magnesium (Mg) or carbon (C), but the present disclosure is not limited thereto. Moreover, the second-type semiconductor layer 25 may be a single-layer or multi-layer structure.

In the embodiment shown in FIG. 1, the end surface 25E of the second-type semiconductor layer 25 is a single flat surface, but the present disclosure is not limited thereto. In some other embodiments, the end surface 25E of the second-type semiconductor layer 25 is not limited to a single surface, and may also be or includes an uneven surface.

The first-type semiconductor layer 21, the light-emitting layer 23, and the second-type semiconductor layer 25 may be formed by an epitaxial growth process. For example, the epitaxial growth process may include metal organic chemical vapor deposition (MOCVD), hydride vapor phase epitaxy (HVPE), molecular beam epitaxy (molecular beam epitaxy, MBE), any other applicable method, or a combination thereof.

Referring to FIG. 1, in some embodiments, the micro light-emitting chip structure 10 includes a first insulating layer 31 disposed on the second-type semiconductor layer 25, a reflective layer 41 disposed on the first insulating layer 31, and a second insulating layer 33 disposed on the reflective layer 41. As shown in FIG. 1, in some embodiments, the first insulating layer 31, the reflective layer 41, and the second insulating layer 33 cover at least the peripheral surface 25S and the end surface 25E of the second-type semiconductor layer 25.

The first insulating layer 31 and the second insulating layer 33 may include an inorganic insulating material, such as silicon oxide ($SiO_2$), silicon nitride ($SiN_x$), aluminum oxide ($Al_2O_3$), titanium oxide ($TiO_2$), similar materials, or a combination thereof, but the present disclosure is not limited thereto. Moreover, the first insulating layer 31 and the second insulating layer 33 may be formed by a deposition process and a patterning process. The deposition process may include chemical vapor deposition (CVD), atomic layer deposition (ALD), any other applicable method, or a combination thereof, but the present disclosure is not limited thereto. The patterning process may include forming a mask layer (not shown) on the aforementioned material, and then etching a portion of the aforementioned material covered by the mask layer (or another portion not covered by the mask layer), but the present disclosure is not limited thereto. The patterning process may also include a dry etching process or a wet etching process.

The second insulating layer 33 may be selected from materials with high reflectivity and low transmittance for light with a wavelength of about 365 nm. In some embodiments, the second insulating layer 33 is a multi-layer dielectric reflective coating. Alternately, the second insulating layer 33 is a single-layer coating with high reflection in UV range.

In some embodiments, the reflective layer 41 is a conductor. For example, the reflective layer 41 may include metal, such as titanium (Ti), aluminum (Al), silver (Ag), gold (Au), platinum (Pt), nickel (Ni), copper (Cu), the like, an alloy thereof, a multilayer stack thereof, or a combination thereof, but the present disclosure is not limited thereto. The reflective layer 41 may be formed by a deposition process and a patterning process. The examples of the deposition process and the patterning process are mentioned above and will not be repeated here.

In the embodiment of the present disclosure, the first insulating layer 31, the reflective layer 41, and the second insulating layer 33 may form an insulator-metal-insulator (IMI) structure. As shown in FIG. 1, in some embodiments, the first insulating layer 31, the reflective layer 41, and the second insulating layer 33 conformally cover the peripheral surface 25S and a part of the end surface 25E. Moreover, as shown in FIG. 1, in some embodiments, the first insulating layer 31, the reflective layer 41, and the second insulating layer 33 extend toward the light-emitting layer 23 and the first-type semiconductor layer 21 along the peripheral surface 25S and cover the light-emitting layer 23 and a part of the first-type semiconductor layer 21.

Referring to FIG. 1, in some embodiments, the micro light-emitting chip structure 10 includes an electrode 51 disposed on the end surface 25E and connected to the second-type semiconductor layer 25, and the micro light-emitting chip structure 10 also includes a dielectric structure 35 between the electrode 51 and the reflective layer 41 and surrounding the electrode 51. That is, the electrode 51 is in direct contact with the second-type semiconductor layer 25. As shown in FIG. 1, the electrode 51 penetrates the second insulating layer 33, the reflective layer 41, and the first insulating layer 31, and the dielectric structure 35 has an annular sidewall 35R facing the electrode 51.

The electrode 51 may include a conductive material, such as metal, metal silicide, the like, or a combination thereof. For example, the metal may be gold (Au), nickel (Ni), platinum (Pt), palladium (Pd), iridium (Ir), titanium (Ti), chromium (Cr), tungsten (W), aluminum (Al), copper (Cu), the like, an alloy thereof, or a combination thereof, but the present disclosure is not limited thereto. As shown in FIG. 1, in some embodiments, the electrode 51 and the reflective layer 41 completely cover the peripheral surface 25S and the end surface 25E of the second-type semiconductor layer 25.

As shown in FIG. 1, in some embodiments, the dielectric structure 35 is connected to the first insulation layer 31 and the second insulation layer 33 and closes a part of the reflective layer 41 adjacent to the electrode 51 on the end surface 25E of the second-type semiconductor layer 25, so as to electrically insulate the electrode 51 from the reflective layer 41.

In some embodiment, the dielectric structure 35 includes different material from the first insulating layer 31 or the second insulating layer 33. For example, the dielectric structure 35 may include organic materials, structural photoresist materials, any other similar material, or a combination thereof, but the present disclosure is not limited thereto.

As shown in FIG. 1, the peripheral surface 25S of the second-type semiconductor layer 25 is an inclined surface, and the cross-sectional width of the second-type semiconductor layer 25 gradually narrows in the direction that is parallel to the light-emitting layer 23 towards the electrode 51 (i.e., direction D1 in FIG. 1). In this embodiment, since the first insulating layer 31, the reflective layer 41, and the second insulating layer 33 conformally cover the peripheral surface 25S and a part of the end surface 25E of the second-type semiconductor layer 25, which may ensure that the reflective layer 41 is uniformly formed on the peripheral surface 25S of the second-type semiconductor layer 25 during the deposition process.

Moreover, the gradual-narrowing cross-sectional width of the second-type semiconductor layer 25 may reduce the incident angle of most incident light on the first insulating layer 31 from the light-emitting layer 23, so that the light is easily transmitted to the reflective layer 41 for reflection, and the probability of total reflection along the surface of the first insulating layer 31 is reduced, thereby effectively improving the overall light-emitting efficiency of the micro light-emitting chip structure 10.

Figure 2:
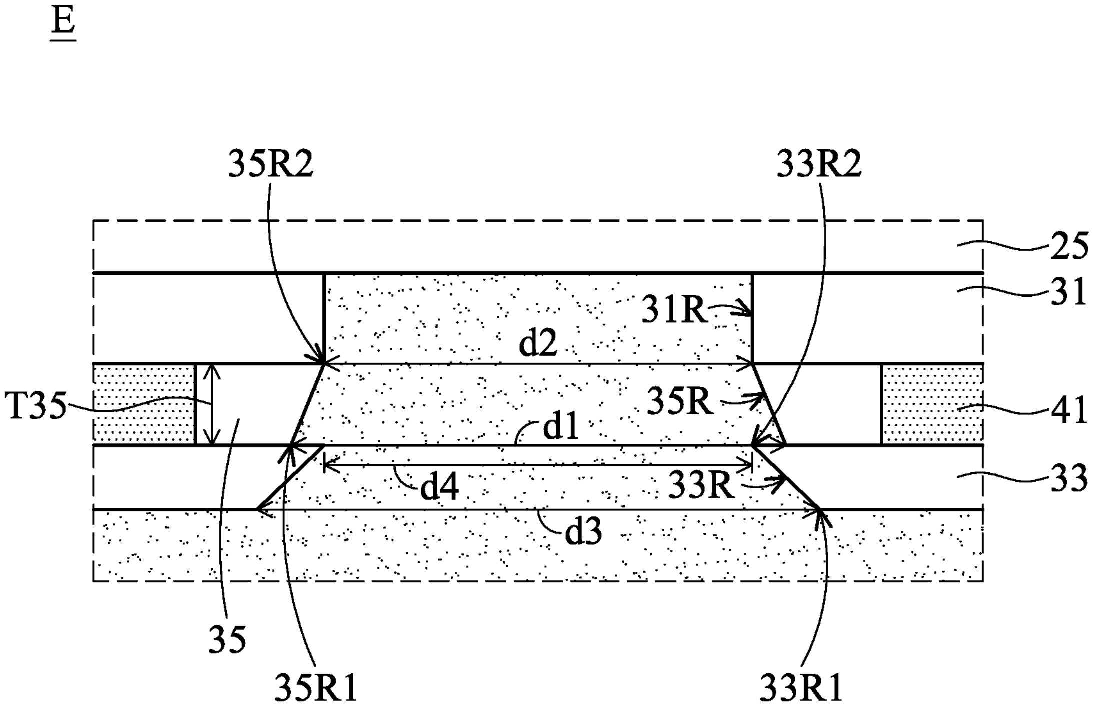
FIG. 2 is an enlarged view illustrating region E of the micro light-emitting chip structure in FIG. 1 according to some embodiments of the present disclosure.

FIG. 2 is an enlarged view illustrating region E of the micro light-emitting chip structure 10 in FIG. 1 according to some embodiments of the present disclosure. As shown in FIG. 1 and FIG. 2, in some embodiments, the annular sidewall 35R of the dielectric structure 35 has a first end 35R1 away from the second-type semiconductor layer 25 and a second end 35R2 close to the second-type semiconductor layer 25. Moreover, in some embodiments, the annular sidewall 35R of the dielectric structure 35 is in direct contact with the electrode 51. In the embodiment shown in FIG. 2, the inner diameter d1 of the first end 35R1 is greater than the inner diameter d2 of the second end 35R2. Duo to the annular sidewall 35R of the dielectric structure 35 that has variable inner diameter, the chance of producing hollow structures during the formation of the electrode 51 may be effectively reduced.

As shown in FIG. 1 and FIG. 2, in some embodiments, the second insulating layer 33 has an annular sidewall 33R facing the electrode 51, and the annular sidewall 33R of the second insulating layer 33 has a third end 33R1 away from the dielectric structure 35 and a fourth end 33R2 close to the dielectric structure 35. In the embodiment shown in FIG. 2, the inner diameter d3 of the third end 33R1 is greater than the inner diameter d4 of the fourth end 33R2.

Moreover, in this embodiment, the inner diameter d1 of the first end 35R1 is greater than the inner diameter d4 of the fourth end 33R2. That is, the first end 35R1 of the annular sidewall 35R of the dielectric structure 35 is more retracted than the fourth end 33R2 of the annular sidewall 33R of the second insulating layer 33. In some embodiments, the difference between the inner diameter d1 of the first end 35R1 and the inner diameter d4 of the fourth end 33R2 is less than 50% of the thickness T35 of the dielectric structure 35. As shown in FIG. 1, the thickness T35 of the dielectric structure 35 is equal to the thickness T41 of the reflective layer 41.

Figure 3:
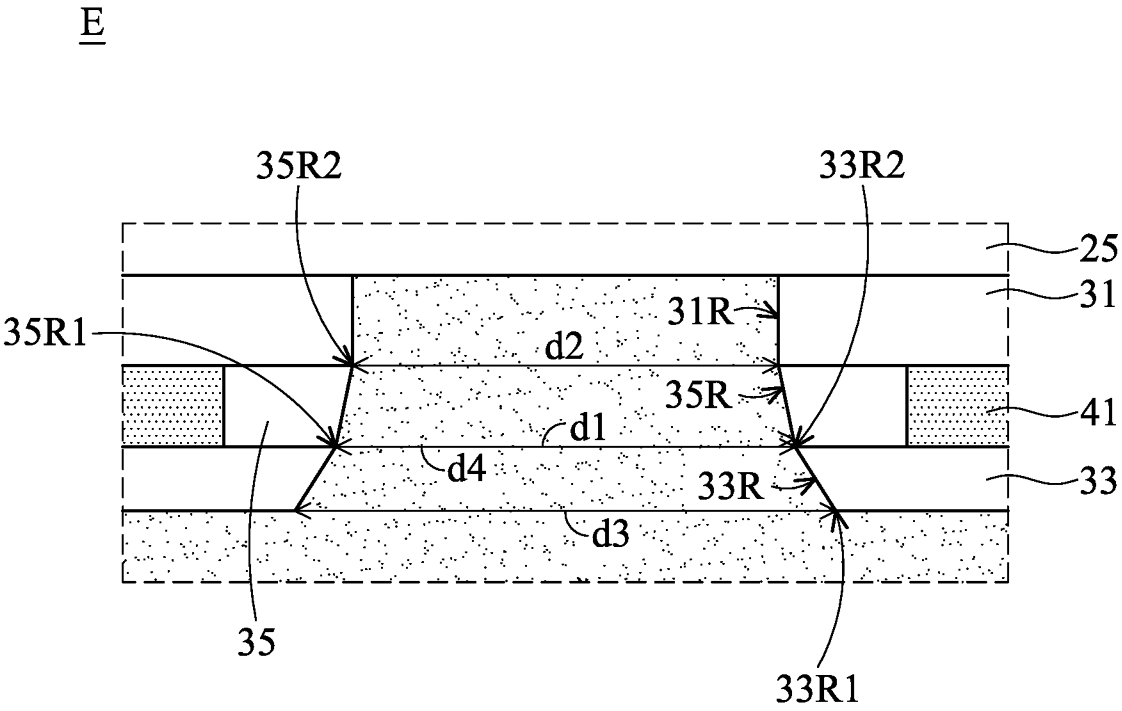
FIG. 3 is another enlarged view illustrating region E of the micro light-emitting chip structure in FIG. 1 according to some other embodiments of the present disclosure.

FIG. 3 is another enlarged view illustrating region E of the micro light-emitting chip structure 10 in FIG. 1 according to some other embodiments of the present disclosure. In the embodiment shown in FIG. 3, the inner diameter d1 of the first end 35R1 is equal to the inner diameter d4 of the fourth end 33R2. In other word, in this embodiment, the orthogonal projection of the first end 35R1 on the second-type semiconductor layer 25 fully overlaps the orthogonal projection of the fourth end 33R2 on the second-type semiconductor layer 25. That is, the first end 35R1 of the annular sidewall 35R of the dielectric structure 35 and the fourth end 33R2 of the annular sidewall 33R of the second insulating layer 33 are continuously joined.

Figure 4:
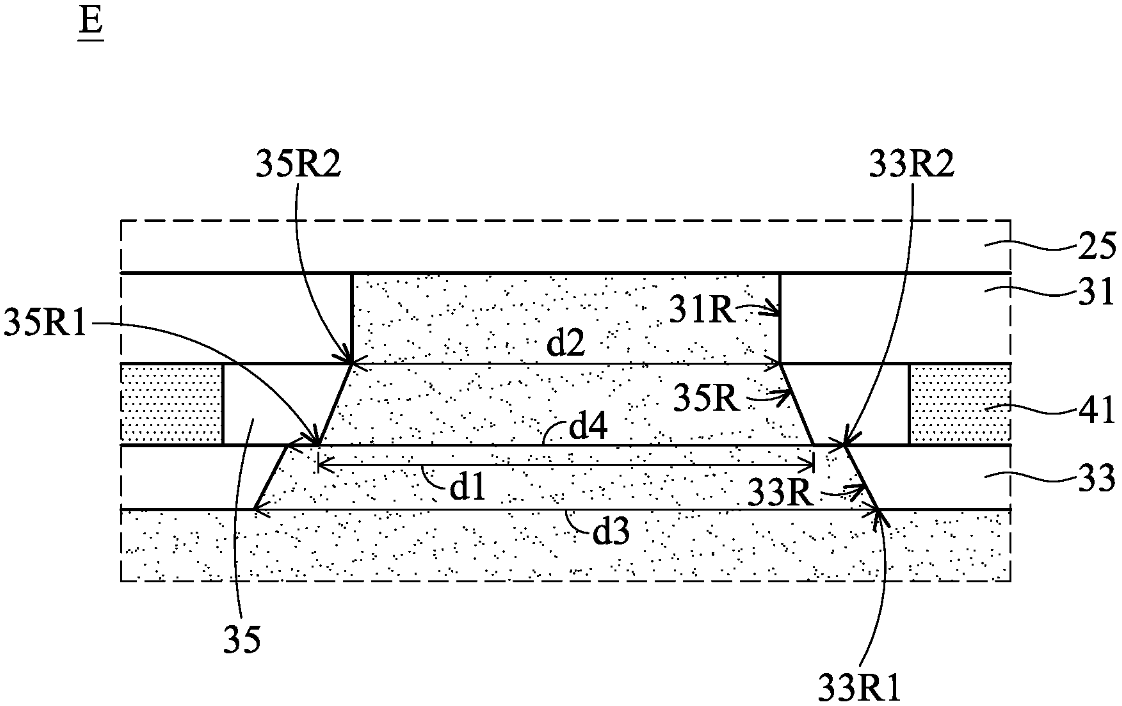
FIG. 4 is another enlarged view illustrating region E of the micro light-emitting chip structure in FIG. 1 according to some other embodiments of the present disclosure.

FIG. 4 is another enlarged view illustrating region E of the micro light-emitting chip structure 10 in FIG. 1 according to some other embodiments of the present disclosure. In the embodiment shown in FIG. 4, the inner diameter d1 of the first end 35R1 is less than the inner diameter d4 of the fourth end 33R2. That is, the first end 35R1 of the annular sidewall 35R of the dielectric structure 35 protrudes more than the fourth end 33R2 of the annular sidewall 33R of the second insulating layer 33.

Figure 5:
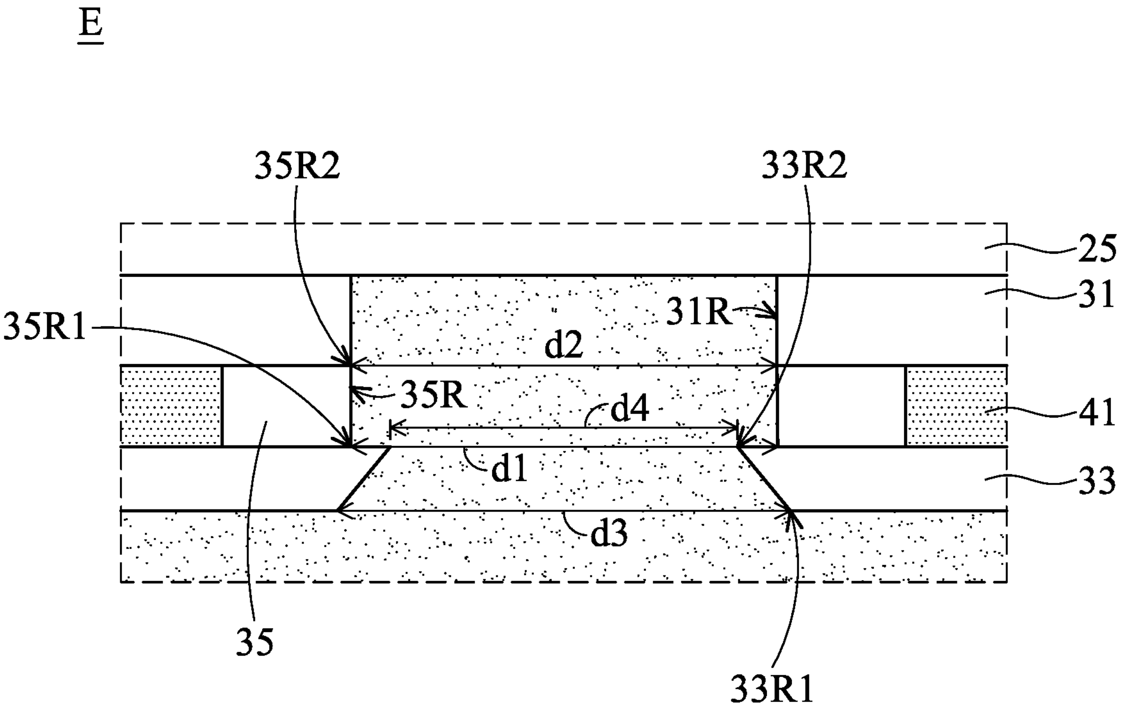
FIG. 5 is another enlarged view illustrating region E of the micro light-emitting chip structure in FIG. 1 according to some other embodiments of the present disclosure.

FIG. 5 is another enlarged view illustrating region E of the micro light-emitting chip structure 10 in FIG. 1 according to some other embodiments of the present disclosure. In the embodiment shown in FIG. 5, the inner diameter d1 of the first end 35R1 is equal to the inner diameter d2 of the second end 35R2. Moreover, in this embodiment, the inner diameter d1 of the first end 35R1 is greater than the inner diameter d4 of the fourth end 33R2. That is, the first end 35R1 of the annular sidewall 35R of the dielectric structure 35 is more retracted than the fourth end 33R2 of the annular sidewall 33R of the second insulating layer 33. Similarly, the difference between the inner diameter d1 of the first end 35R1 and the inner diameter d4 of the fourth end 33R2 is less than 50% of the thickness (not labeled in FIG. 5) of the dielectric structure 35.

Figure 6:
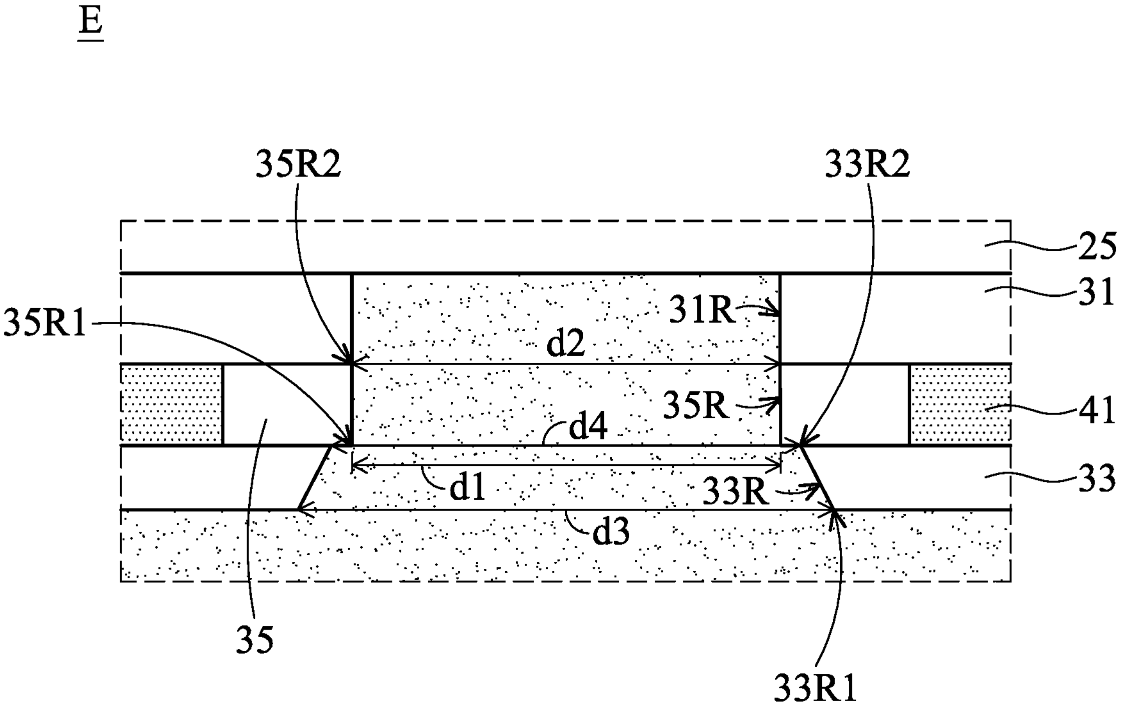
FIG. 6 is another enlarged view illustrating region E of the micro light-emitting chip structure in FIG. 1 according to some other embodiments of the present disclosure.

FIG. 6 is another enlarged view illustrating region E of the micro light-emitting chip structure 10 in FIG. 1 according to some other embodiments of the present disclosure. In the embodiment shown in FIG. 6, the inner diameter d1 of the first end 35R1 is equal to the inner diameter d2 of the second end 35R2. Moreover, in this embodiment, the inner diameter d1 of the first end 35R1 is less than the inner diameter d4 of the fourth end 33R2. That is, the first end 35R1 of the annular sidewall 35R of the dielectric structure 35 protrudes more than the fourth end 33R2 of the annular sidewall 33R of the second insulating layer 33.

Figure 7:
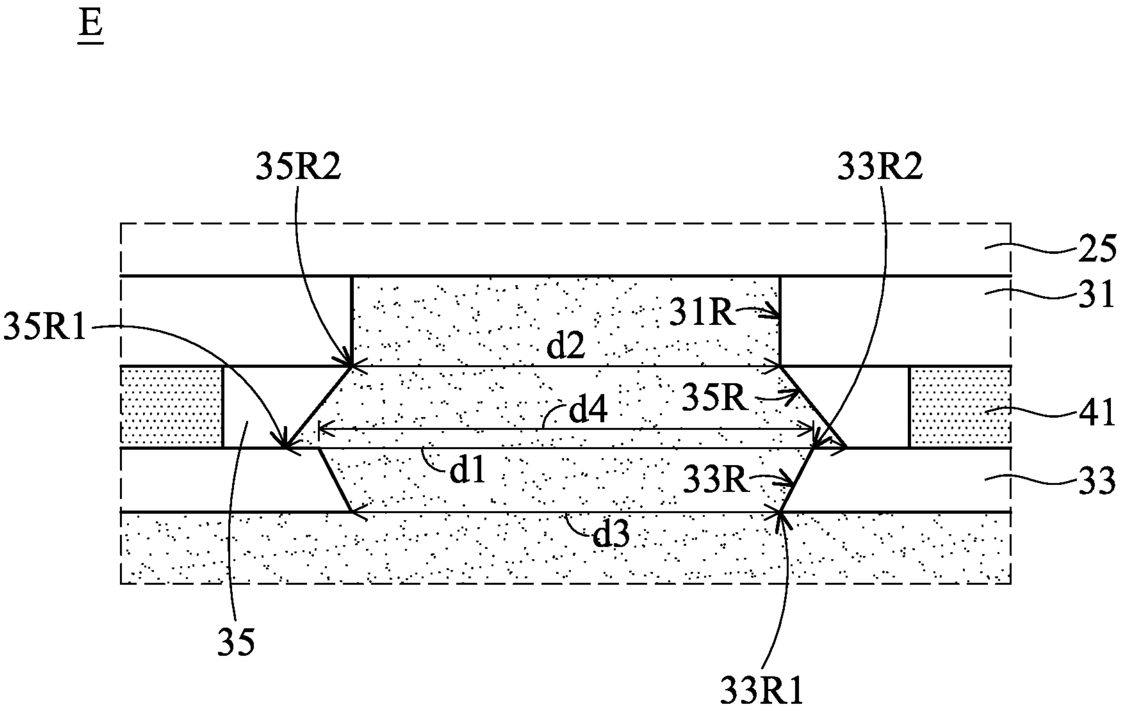
FIG. 7 is another enlarged view illustrating region E of the micro light-emitting chip structure in FIG. 1 according to some other embodiments of the present disclosure.

FIG. 7 is another enlarged view illustrating region E of the micro light-emitting chip structure 10 in FIG. 1 according to some other embodiments of the present disclosure. In the embodiment shown in FIG. 7, the inner diameter d1 of the first end 35R1 is greater than the inner diameter d2 of the second end 35R2, and the inner diameter d3 of the third end 33R1 is less than the inner diameter d4 of the fourth end 33R2. Moreover, in this embodiment, the inner diameter d1 of the first end 35R1 is greater than the inner diameter d4 of the fourth end 33R2. That is, the first end 35R1 of the annular sidewall 35R of the dielectric structure 35 is more retracted than the fourth end 33R2 of the annular sidewall 33R of the second insulating layer 33. Similarly, the difference between the inner diameter d1 of the first end 35R1 and the inner diameter d4 of the fourth end 33R2 is less than 50% of the thickness (not labeled in FIG. 7) of the dielectric structure 35.

Figure 8:
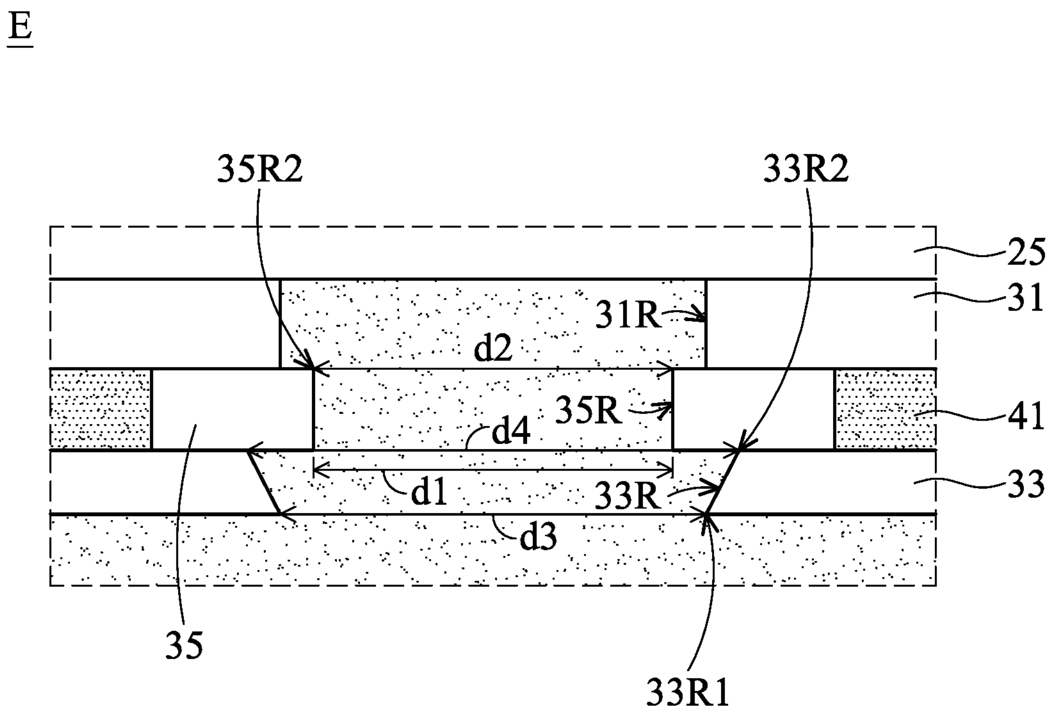
FIG. 8 is another enlarged view illustrating region E of the micro light-emitting chip structure in FIG. 1 according to some other embodiments of the present disclosure.

FIG. 8 is another enlarged view illustrating region E of the micro light-emitting chip structure 10 in FIG. 1 according to some other embodiments of the present disclosure. In the embodiment shown in FIG. 8, the inner diameter d1 of the first end 35R1 is equal to the inner diameter d2 of the second end 35R2, and the inner diameter d3 of the third end 33R1 is less than the inner diameter d4 of the fourth end 33R2. Moreover, in this embodiment, the inner diameter d1 of the first end 35R1 is less than the inner diameter d4 of the fourth end 33R2. That is, the first end 35R1 of the annular sidewall 35R of the dielectric structure 35 protrudes more than the fourth end 33R2 of the annular sidewall 33R of the second insulating layer 33.

In the embodiments shown above, the first insulating layer 31 also has an annular sidewall 31R facing the electrode 51. Moreover, the difference between the maximum inner diameter and the minimum inner diameter of the annular sidewall 31R of the first insulating layer 31, the annular sidewall 35R of the dielectric structure 35, and the annular sidewall 33R of the second insulating layer 33 is less than 50% of the total thickness T (shown in FIG. 1) of the first insulating layer 31, the dielectric structure 35, and the second insulating layer 33. Therefore, the chance of producing hollow structures during the formation of the electrode 51 may be effectively reduced.

Figure 9:
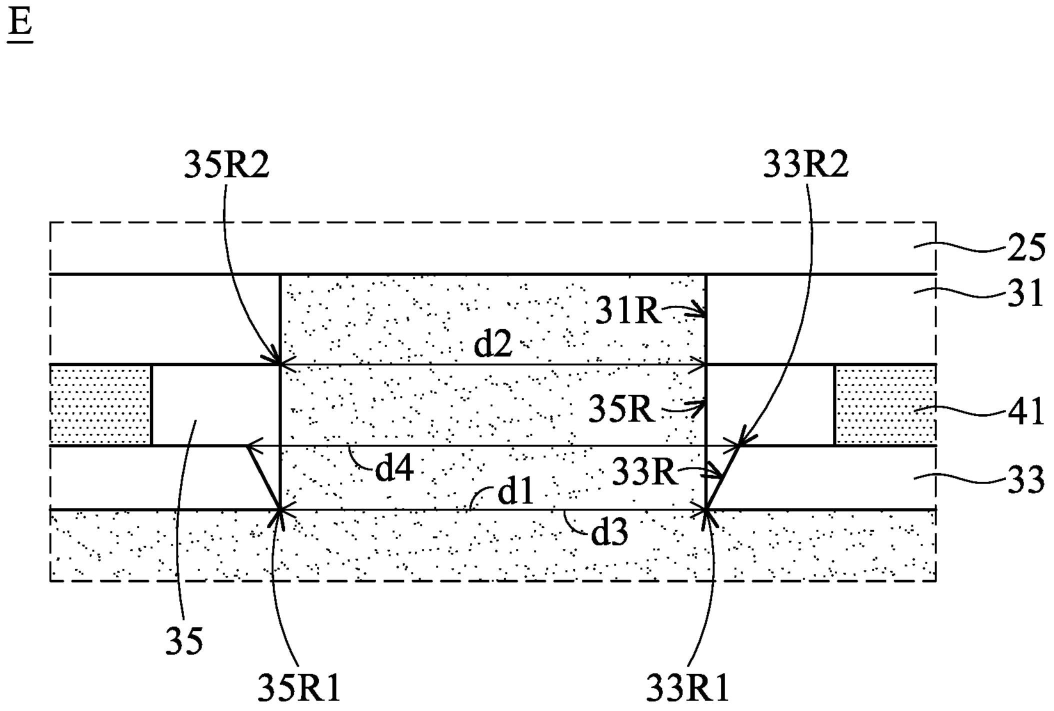
FIG. 9 is another enlarged view illustrating region E of the micro light-emitting chip structure in FIG. 1 according to some other embodiments of the present disclosure.

FIG. 9 is another enlarged view illustrating region E of the micro light-emitting chip structure 10 in FIG. 1 according to some other embodiments of the present disclosure. In the embodiment shown in FIG. 9, the dielectric structure 35 covers the annular sidewall 33R of the second insulating layer 33. Moreover, the annular sidewall 35R of the dielectric structure 35 and the annular sidewall 31R of the first insulating layer 31 are aligned with each other and perpendicular to the second-type semiconductor layer 25.

Figure 10:
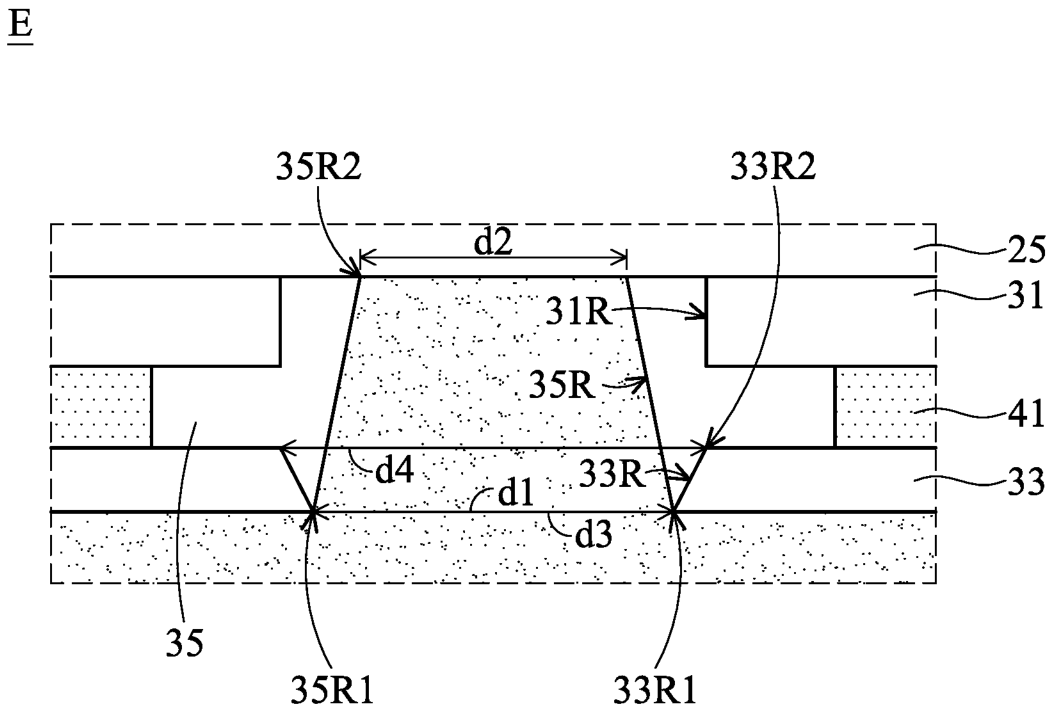
FIG. 10 is another enlarged view illustrating region E of the micro light-emitting chip structure in FIG. 1 according to some other embodiments of the present disclosure.

FIG. 10 is another enlarged view illustrating region E of the micro light-emitting chip structure 10 in FIG. 1 according to some other embodiments of the present disclosure. In the embodiment shown in FIG. 10, the dielectric structure 35 covers the annular sidewall 33R of the second insulating layer 33 and the annular sidewall 31R of the first insulating layer 31. Moreover, the inner diameter of the annular sidewall 35R of the dielectric structure 35 gradually narrows in the direction towards the second-type semiconductor layer 25, but the present disclosure is not limited thereto.

Figure 11:
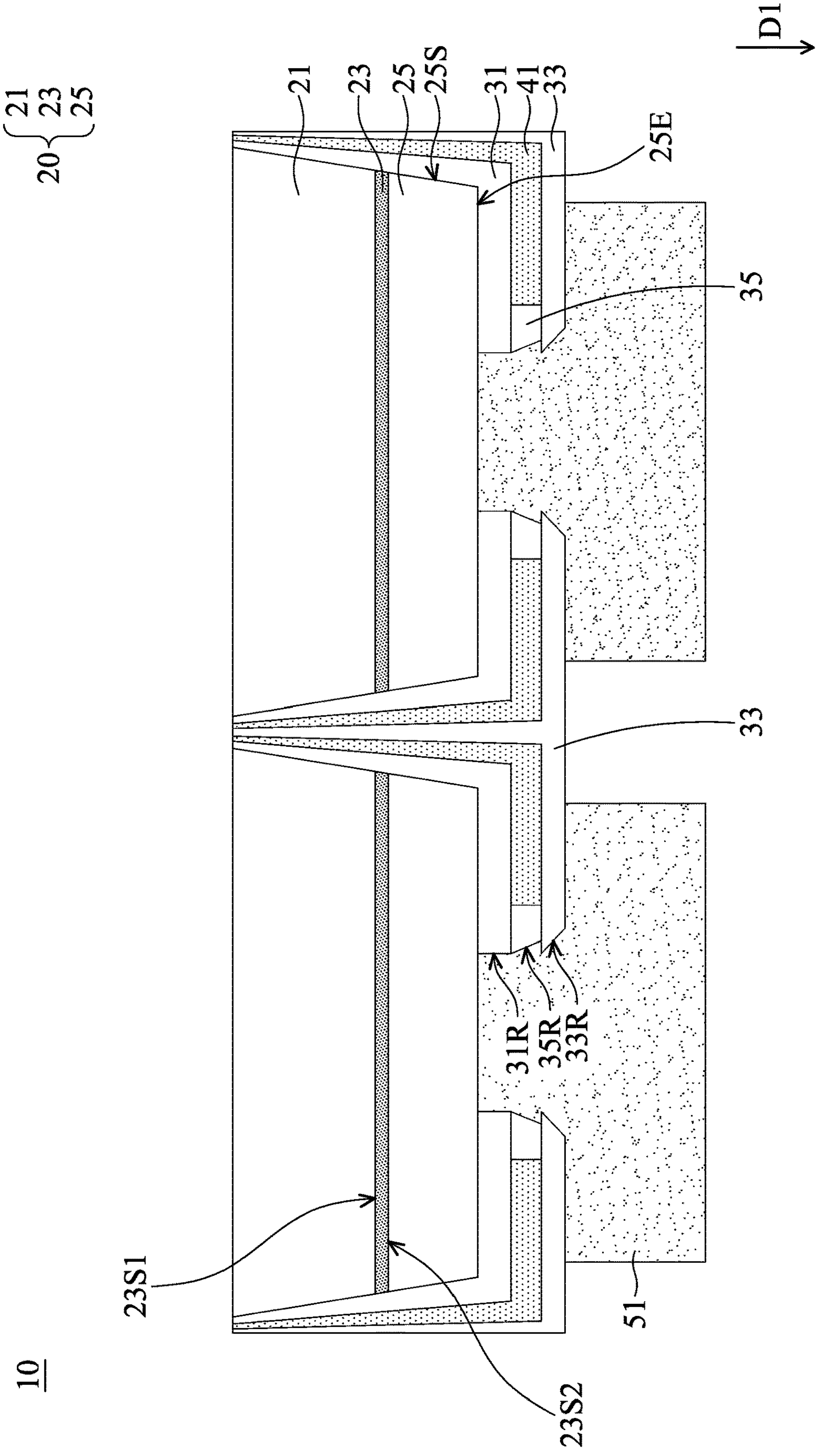
FIG. 11 is a cross-sectional view illustrating a portion of the micro light-emitting chip structure according to some embodiments of the present disclosure.

FIG. 11 is a cross-sectional view illustrating a portion of the micro light-emitting chip structure 10 according to some embodiments of the present disclosure. For example, the micro light-emitting chip structure 10 shown in FIG. 1 may be part of the micro light-emitting chip structure 10 shown in FIG. 11, but the present disclosure is not limited thereto.

As shown in FIG. 11, in some embodiments, the first-type semiconductor layer 21, the light-emitting layer 23, and the second-type semiconductor layer 25 form an epitaxial light-emitting unit 20. Moreover, in some embodiments, the micro light-emitting chip structure 10 includes a plurality of epitaxial light-emitting units 20 (i.e., at least two epitaxial light-emitting units 20), and the second insulating layer 33 covers two adjacent epitaxial light-emitting units 20.

Figure 12A:
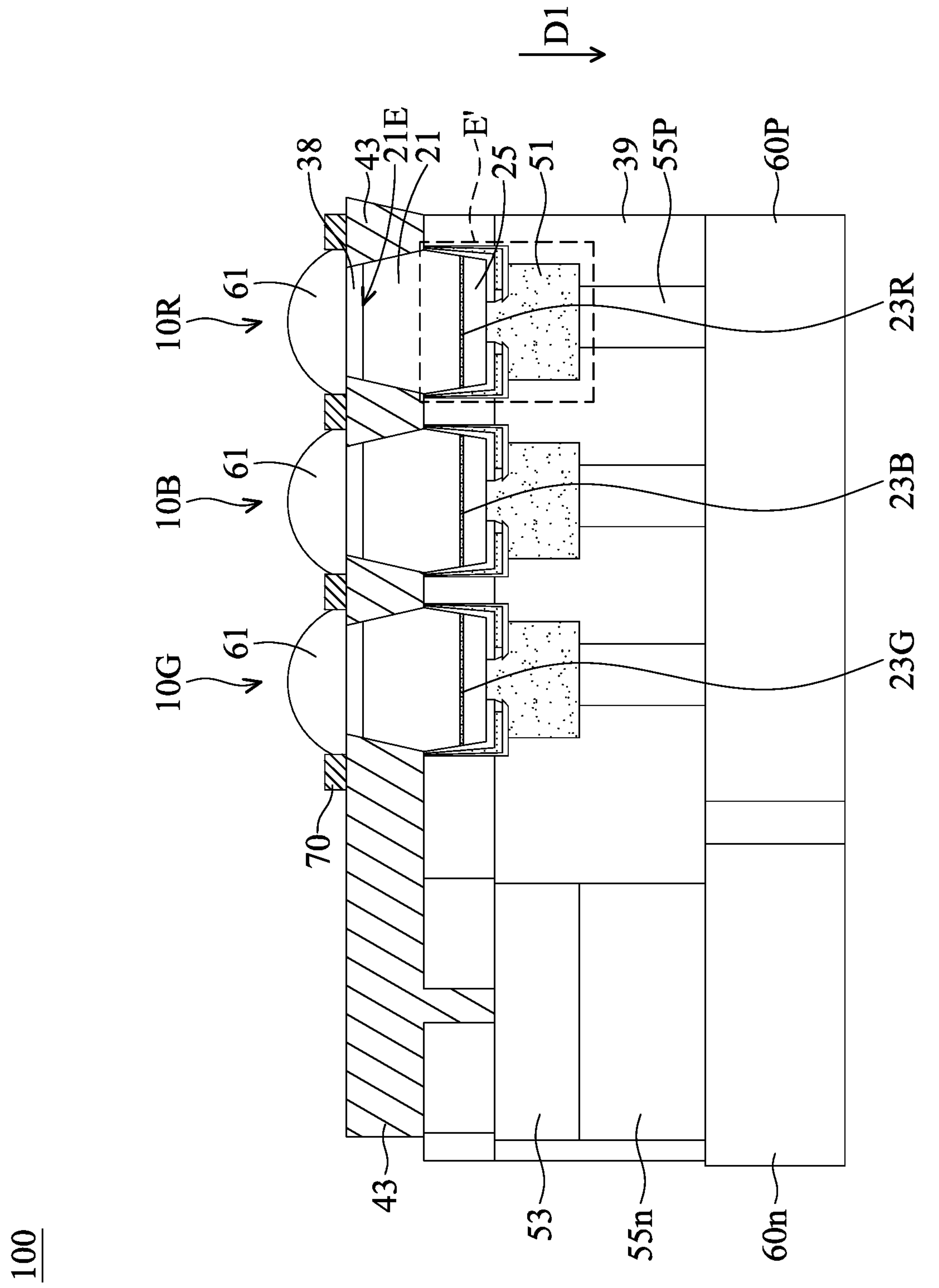
FIG. 12A is a cross-sectional view illustrating a portion of the micro display structure according to some embodiments of the present disclosure.
Figure 12B:
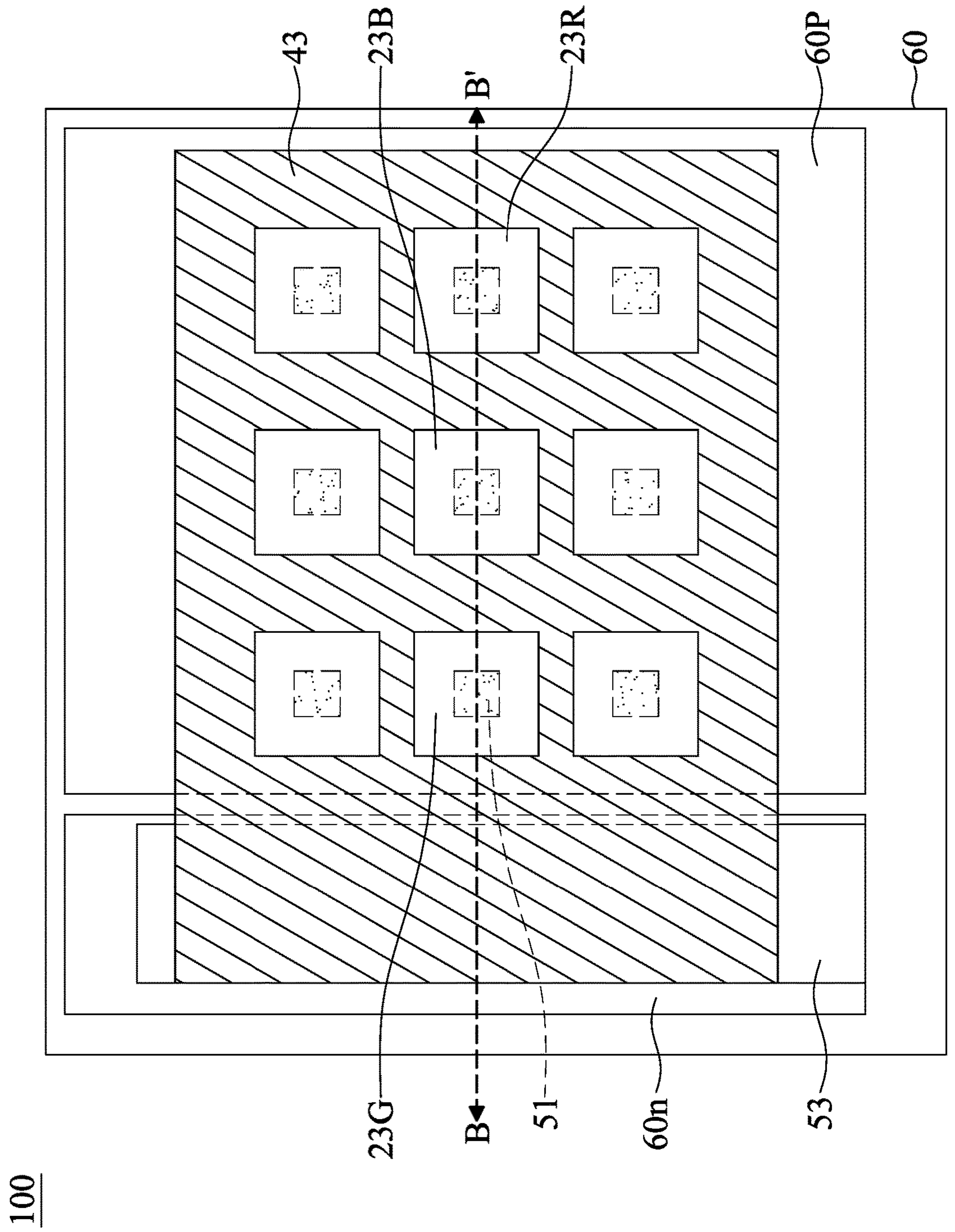
FIG. 12B is a top view of a portion of the micro display structure according to some embodiments of the present disclosure.

FIG. 12A is a cross-sectional view illustrating a portion of the micro display structure 100 according to some embodiments of the present disclosure. FIG. 12B is a top view of a portion of the micro display structure 100 according to some embodiments of the present disclosure. For example, FIG. 12A may be a cross-sectional view taken along line B-B' in FIG. 12B, and the micro display structure 100 may be a micro light-emitting diode (micro LED) display panel, but the present disclosure is not limited thereto. Similarly, some components of the micro display structure 100 have been omitted in FIG. 12A and FIG. 12B for the sake of brevity. Moreover, what is shown in FIG. 12B is only a part of the array structure of the micro display structure 100. For convenience of description, the boundary lines of related components are not drawn according to the actual display configuration.

Referring to FIG. 12A, in some embodiments, the micro display structure 100 includes multiple micro light-emitting chip structures (only three are shown in FIG. 12A). In some embodiments, multiple micro light-emitting chip structures may be arranged in an array. For example, the micro display structure 100 may include micro light-emitting chip structures 10G, 10B, and 10R, wherein the light-emitting layer 23G of the micro light-emitting chip structure 10G emits green light, the light-emitting layer 23B of the micro light-emitting chip structure 10B emits blue light, and the light-emitting layer 23R of the micro light-emitting chip structure 10R emits red light. That is, the micro-light-emitting chip structures 10G, 10B, and 10R emit lights of different colors, but the present disclosure is not limited thereto.

As shown in FIG. 12A, in some embodiments, the micro light-emitting chip structures 10G, 10B, and 10R have the same or similar structure as the micro light-emitting chip structure 10 shown in FIG. 1. For example, the micro light-emitting chip structure 10 shown in FIG. 1 may be, for example, an enlarged view of region E' in FIG. 12A.

As shown in FIG. 12A, in some embodiments, the micro display structure 100 includes an ohmic contact layer 43 patterned between the micro light-emitting chip structures 10G, 10B, and 10R and electrically connected to at least a portion of the first-type semiconductor layer 21 of the micro-light-emitting chip structures 10G, 10B, and 10R. For example, in FIG. 12A, the ohmic contact layer 43 covers the upper half of the first-type semiconductor layers 21, and the ohmic contact layer 43 is connected to at least one of the first insulating layer 31, the reflective layer 41, and the second insulating layer 33. In this embodiment, the ohmic contact layer 43 is simultaneously connected to the first insulating layer 31, the reflective layer 41, and the second insulating layer 33, but the present disclosure is not limited thereto. For example, in some other embodiments, the ohmic contact layer 43 may only contact the first insulating layer 31 and the reflective layer 41, or only contact the first insulating layer 31.

As shown in FIG. 12A, in some embodiments, the first-type semiconductor layer 21 has a light-emitting surface 21E on the side facing away from the light-emitting layer 23R (or 23G, 23B), and the micro display structure 100 further includes a refractive structure 61 disposed on the light-emitting surface 21E of the first-type semiconductor layer 21. The refractive structure 61 may be a micro-lens. For example, the micro-lens may include a semi-convex lens or a convex lens, but the present disclosure is not limited thereto. The refractive structure 61 may also include micro-pyramid structures (e.g., cones, quadrangular pyramids, etc.) or micro-trapezoidal structures (e.g., flat-topped cones, flat-topped quadrangular pyramids, etc.). Alternatively, the refractive structure 61 may be a gradient-index structure.

As shown in FIG. 12A, in some embodiments, the micro display structure 100 further includes a hard mask 38 disposed between the first-type semiconductor layer 21 and the refractive structure 61. The hard mask layer 38 may be used as a protective layer of the first-type semiconductor layer 21, and includes the same or similar materials as the first insulating layer 31 and the second insulating layer 33, but the present disclosure are not limited thereto.

As shown in FIG. 12A, in some embodiments, the micro display structure 100 further includes multiple light-shielding layers 70 disposed on the ohmic contact layer 43 and between the refractive structures 61. For example, the light-shielding layer 70 may correspond to the junction of the micro light-emitting chip structures 10G, 10B, and 10R. The light-shielding layer 70 may include photoresist (e.g., black photoresist, or other applicable photoresist which is not transparent), ink (e.g., black photoresist to absorb light or white photoresist to reflect light), molding compound, solder mask, epoxy polymer, any other applicable material, or a combination thereof. Moreover, the light-shielding layer 70 may include a light curing material, a thermal curing material, or a combination thereof, but the present disclosure is not limited thereto. The light-shielding layer 70 may form a black matrix to prevent crosstalk between the micro light-emitting chip structures 10G, 10B, and 10R.

As shown in FIG. 12A and FIG. 12B, the micro display structure 100 includes a display substrate 60. The display substrate 60 may include an elementary semiconductor (e.g., silicon or germanium), a compound semiconductor (e.g., silicon carbide (SiC), gallium arsenic (GaAs), indium arsenide (InAs), or indium phosphide (InP)), an alloy semiconductor (e.g., silicon germanium (SiGe), silicon germanium carbide (SiGeC), gallium arsenic phosphide (GaAsP), or gallium indium phosphide (GaInP)), any other applicable semiconductor, or a combination thereof. Referring to FIG. 12B, the micro light-emitting chip structures 10G, 10B, and 10R are arranged on the display substrate 60 and electrically connected to the display substrate 60.

The display substrate 60 may have an integrated circuit (IC) composed of various circuit layers. As shown in FIG. 12A, the circuit layers may include a p-pole 60*p* and an n-pole 60*n*. The micro light-emitting chip structures 10G, 10B, and 10R may be electrically connected to the p-pole 60*p* of the circuit layer through their respective electrodes 51 (e.g., the electrodes 51 are connected to the conductive channel 55*p*), thereby independently controlling the micro light-emitting chip structures 10G, 10B, and 10R; the common electrode structure formed by the ohmic contact layer 43 may be electrically connected to the n-pole 60*n* of the circuit layer through the conductive channel 55*n* (e.g., the ohmic contact layer 43 is connected to the pad 53, and the pad 53 is connected to the conductive channel 55*n*), but the present disclosure is not limited thereto.

As shown in FIG. 12A, in some embodiments, the micro display structure 100 further includes an underfill layer 39 for stabilizing the overall structure of the micro display structure 100 and preventing moisture from entering the micro display structure 100. For example, the underfill layer 39 may include the same or similar material as the first insulating layer 31 and the second insulating layer 33, but the present disclosure is not limited thereto.

As noted above, according to the embodiments of the present disclosure, duo to the structure of the dielectric structure (and the second insulating layer), the chance of producing hollow structures during the formation of the electrode may be effectively reduced.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure. Therefore, the scope of protection should be determined through the claims. In addition, although some embodiments of the present disclosure are disclosed above, they are not intended to limit the scope of the present disclosure.

Reference throughout this specification to features, advantages, or similar language does not imply that all of the features and advantages that may be realized with the present disclosure should be or are in any single embodiment of the disclosure. Rather, language referring to the features and advantages is understood to mean that a specific feature, advantage, or characteristic described in connection with an embodiment is included in at least one embodiment of the present disclosure. Thus, discussions of the features and advantages, and similar language, throughout this specification may, but do not necessarily, refer to the same embodiment.

Furthermore, the described features, advantages, and characteristics of the disclosure may be combined in any suitable manner in one or more embodiments. One skilled in the relevant art will recognize, in light of the description herein, that the disclosure can be practiced without one or more of the specific features or advantages of a particular embodiment. In other instances, additional features and advantages may be recognized in certain embodiments that may not be present in all embodiments of the disclosure.

What is claimed is:

1. A micro light-emitting chip structure, comprising:

a first-type semiconductor layer;

a light-emitting layer disposed on the first-type semiconductor layer;

a second-type semiconductor layer disposed on the light-emitting layer and having a peripheral surface and an end surface that is connected to the peripheral surface;

a first insulating layer disposed on the second-type semiconductor layer;

a reflective layer disposed on the first insulating layer and covering the end surface;

a second insulating layer disposed on the reflective layer;

an electrode disposed on the end surface and connected to the second-type semiconductor layer, wherein the electrode penetrates the second insulating layer, the reflective layer, and the first insulating layer; and a dielectric structure laterally disposed between the electrode and the reflective layer and surrounding the electrode, wherein the dielectric structure has a first annular sidewall facing the electrode, wherein the first annular sidewall has a first end away from the second-type semiconductor layer and a second end close to the second-type semiconductor layer, and an inner diameter of the first end is greater than or equal to an inner diameter of the second end, wherein the second insulating layer has a second annular sidewall facing the electrode, the second annular sidewall has a third end away from the dielectric structure and a fourth end close to the dielectric structure, and an orthogonal projection of the first end on the second-type semiconductor layer fully overlaps an orthogonal projection of the fourth end on the second-type semiconductor layer, and wherein the second insulating layer is laterally in direct contact with the electrode, and the dielectric structure is disposed between and in direct contact with the first insulating layer and the second insulating layer on the end surface in a longitudinal direction that is parallel to a stacking direction from the light-emitting layer towards the electrode.

2. The micro light-emitting chip structure as claimed in claim 1, wherein the first annular sidewall is in direct contact with the electrode.

3. The micro light-emitting chip structure as claimed in claim 1, wherein the inner diameter of the first end is less than an inner diameter of the fourth end.

4. The micro light-emitting chip structure as claimed in claim 1, wherein the inner diameter of the first end is greater than an inner diameter of the fourth end, and the difference between the inner diameter of the first end and the inner diameter of the fourth end is less than 50% of a thickness of the dielectric structure.

5. The micro light-emitting chip structure as claimed in claim 1, wherein the second insulating layer is a multi-layer dielectric reflective coating.

6. The micro light-emitting chip structure as claimed in claim 1, wherein the first-type semiconductor layer, the light-emitting layer, and the second-type semiconductor layer form an epitaxial light-emitting unit, the micro light-emitting chip structure comprises a plurality of epitaxial light-emitting units, and the second insulating layer covers two adjacent epitaxial light-emitting units.

7. The micro light-emitting chip structure as claimed in claim 1, wherein a thickness of the dielectric structure is equal to a thickness of the reflective layer.

8. A micro light-emitting chip structure, comprising:
- a first-type semiconductor layer;
- a light-emitting layer disposed on the first-type semiconductor layer;
- a second-type semiconductor layer disposed on the light-emitting layer and having a peripheral surface and an end surface that is connected to the peripheral surface;
- a first insulating layer disposed on the second-type semiconductor layer;
- a reflective layer disposed on the first insulating layer and covering the end surface;
- a second insulating layer disposed on the reflective layer;
- an electrode disposed on the end surface and connected to the second-type semiconductor layer, wherein the electrode penetrates the second insulating layer, the reflective layer, and the first insulating layer; and
- a dielectric structure laterally disposed between the electrode and the reflective layer and surrounding the electrode, wherein the dielectric structure has a first annular sidewall facing the electrode,
- wherein the first annular sidewall has a first end away from the second-type semiconductor layer and a second end close to the second-type semiconductor layer, and an inner diameter of the first end is greater than or equal to an inner diameter of the second end,
- wherein the second insulating layer has a second annular sidewall facing the electrode, and the second annular sidewall has a third end away from the dielectric structure and a fourth end close to the dielectric structure,
- wherein the second insulating layer is laterally in direct contact with the electrode, and the dielectric structure is disposed between and in direct contact with the first insulating layer and the second insulating layer on the end surface in a longitudinal direction that is parallel to a stacking direction from the light-emitting layer towards the electrode, and
- wherein the first insulating layer has a third annular sidewall facing the electrode, and the difference between a maximum inner diameter and a minimum inner diameter of the first annular sidewall, the second annular sidewall, and the third annular sidewall is less than 50% of a total thickness of the first insulating layer, the dielectric structure, and the second insulating layer.

9. The micro light-emitting chip structure as claimed in claim 8, wherein the dielectric structure covers the second annular sidewall.

10. The micro light-emitting chip structure as claimed in claim 9, wherein the dielectric structure further covers the third annular sidewall.

11. A micro display structure, comprising:
- a display substrate;
- micro light-emitting chip structures arranged on the display substrate, wherein each of the micro light-emitting chip structures comprises:
  - a first-type semiconductor layer;
  - a light-emitting layer disposed on the first-type semiconductor layer;
  - a second-type semiconductor layer disposed on the light-emitting layer and having a peripheral surface and an end surface that is connected to the peripheral surface;
  - a first insulating layer disposed on the second-type semiconductor layer;
  - a reflective layer disposed on the first insulating layer and covering the end surface;
  - a second insulating layer disposed on the reflective layer;
  - an electrode disposed on the end surface and connected to the second-type semiconductor layer, wherein the electrode penetrates the second insulating layer, the reflective layer, and the first insulating layer; and
  - a dielectric structure laterally disposed between the electrode and the reflective layer and surrounding the electrode, wherein the dielectric structure has a first annular sidewall facing the electrode,
  - wherein the first annular sidewall has a first end away from the second-type semiconductor layer and a second end close to the second-type semiconductor layer, and an inner diameter of the first end is greater than or equal to an inner diameter of the second end,
  - wherein the second insulating layer has a second annular sidewall facing the electrode, the second annular sidewall has a third end away from the dielectric structure and a fourth end close to the dielectric structure, and an orthogonal projection of the first end on the second-type semiconductor layer fully overlaps an orthogonal projection of the fourth end on the second-type semiconductor layer, and
  - wherein the second insulating layer is laterally in direct contact with the electrode, and the dielectric structure is disposed between and in direct contact with the first insulating layer and the second insulating layer on the end surface in a longitudinal direction that is parallel to a stacking direction from the light-emitting layer towards the electrode; and
- an ohmic contact layer patterned between the micro light-emitting chip structures and electrically connected to the first-type semiconductor layer of the micro-light-emitting chip structures.

* * * * *